(12) United States Patent
Otagiri et al.

(10) Patent No.: US 10,714,676 B2
(45) Date of Patent: Jul. 14, 2020

(54) SENSOR AND SENSOR SYSTEM

(71) Applicants: Mizuki Otagiri, Kanagawa (JP);
Tsuneaki Kondoh, Kanagawa (JP);
Yuko Arizumi, Kanagawa (JP);
Tomoaki Sugawara, Kanagawa (JP);
Junichiro Natori, Kanagawa (JP);
Mayuka Araumi, Tokyo (JP);
Hideyuki Miyazawa, Kanagawa (JP);
Makito Nakashima, Kanagawa (JP);
Kimio Aoki, Shizuoka (JP); Takahiro Imai, Tokyo (JP); Megumi Kitamura, Kanagawa (JP); Yuki Hoshikawa, Kanagawa (JP)

(72) Inventors: Mizuki Otagiri, Kanagawa (JP);
Tsuneaki Kondoh, Kanagawa (JP);
Yuko Arizumi, Kanagawa (JP);
Tomoaki Sugawara, Kanagawa (JP);
Junichiro Natori, Kanagawa (JP);
Mayuka Araumi, Tokyo (JP);
Hideyuki Miyazawa, Kanagawa (JP);
Makito Nakashima, Kanagawa (JP);
Kimio Aoki, Shizuoka (JP); Takahiro Imai, Tokyo (JP); Megumi Kitamura, Kanagawa (JP); Yuki Hoshikawa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 113 days.

(21) Appl. No.: 15/813,321

(22) Filed: Nov. 15, 2017

(65) Prior Publication Data
US 2018/0145244 A1  May 24, 2018

(30) Foreign Application Priority Data

Nov. 18, 2016  (JP) .................................. 2016-225093
Feb. 14, 2017  (JP) .................................. 2017-025394

(51) Int. Cl.
*H01L 41/113* (2006.01)
*G01L 5/22* (2006.01)
(Continued)

(52) U.S. Cl.
CPC ............ *H01L 41/1132* (2013.01); *G01L 1/18* (2013.01); *G01L 1/205* (2013.01); *G01L 1/2287* (2013.01);
(Continued)

(58) Field of Classification Search
CPC . H01L 41/1132; H01L 41/0477; G01L 5/226; G01L 1/2287; G01L 1/18; G01L 1/205; H02N 1/04
See application file for complete search history.

(56) References Cited

U.S. PATENT DOCUMENTS

2014/0111063 A1* 4/2014 Bae ..................... H01L 41/0477
                                                              310/339
2014/0312737 A1* 10/2014 Jenninger ............. H01L 41/083
                                                              310/319
(Continued)

FOREIGN PATENT DOCUMENTS

| JP | 2008-190902 | 8/2008 | |
| JP | 2016-103967 | 6/2016 | |
| WO | WO 2015003497 | * 1/2015 | ............... H02N 1/04 |

OTHER PUBLICATIONS

English machine translation for WO 2015003497.*

*Primary Examiner* — Daniel S Larkin
*Assistant Examiner* — Anthony W Megna Fuentes
(74) *Attorney, Agent, or Firm* — Oblon, McClelland, Maier & Neustadt, L.L.P.

(57) ABSTRACT

A sensor includes a plurality of elements and an insulating layer. The plurality of elements is deformable to generate power. The insulating layer is interposed between the plu-
(Continued)

rality of elements. Each of the plurality of elements includes a pair of electrodes and an intermediate layer. The intermediate layer is disposed between the pair of electrodes and formed of one of a rubber and a rubber composition.

10 Claims, 9 Drawing Sheets

(51) Int. Cl.
  *G01L 1/18* (2006.01)
  *G01L 1/22* (2006.01)
  *H02N 1/04* (2006.01)
  *H01L 41/047* (2006.01)
  *G01L 1/20* (2006.01)

(52) U.S. Cl.
  CPC .......... *G01L 5/226* (2013.01); *H01L 41/0477* (2013.01); *H02N 1/04* (2013.01)

(56) References Cited

U.S. PATENT DOCUMENTS

| | | |
|---|---|---|
| 2016/0328066 A1 | 11/2016 | Kondoh et al. |
| 2016/0336505 A1 | 11/2016 | Arizumi et al. |
| 2016/0341381 A1 | 11/2016 | Imai et al. |
| 2016/0344309 A1 | 11/2016 | Otagiri et al. |
| 2017/0093305 A1 | 3/2017 | Sugawara et al. |
| 2017/0148973 A1 | 5/2017 | Imai et al. |
| 2017/0149357 A1 | 5/2017 | Otagiri et al. |
| 2017/0170749 A1 | 6/2017 | Arizumi et al. |
| 2017/0207729 A1 | 7/2017 | Kondoh et al. |
| 2017/0214338 A1 | 7/2017 | Otagiri et al. |

\* cited by examiner

SENSOR AND SENSOR SYSTEM

CROSS-REFERENCE TO RELATED APPLICATIONS

This patent application is based on and claims priority pursuant to 35 U.S.C. § 119(a) to Japanese Patent Application Nos. 2016-225093, filed on Nov. 18, 2016, and 2017-025394, filed on Feb. 14, 2017, in the Japan Patent Office, the entire disclosure of each of which is hereby incorporated by reference herein.

BACKGROUND

Technical Field

Aspects of the present disclosure relate to a sensor and a sensor system.

Related Art

In recent years, there are an increasing number of robots called a service robot or a cooperative robot, used at a place close to a person. Therefore, the robot needs to secure safety of persons around the robot. As a technique for securing safety, a sensor for detecting collision with a person or an object is disposed, for example. Examples of the sensor include a contact sensor using a piezoelectric element. Examples of the piezoelectric element include ceramic (PZT) and a polymer (PVDF). In a case of disposing a contact sensor (sensor) in a robot, the contact sensor is attached to a surface of the robot in many cases. However, considering that the contact sensor is disposed at any attachment position, the sensor is desirably soft. A surface of the robot is also desirably as soft as possible from a viewpoint of safety. When a contact sensor is attached to a soft surface, the contact sensor itself is preferably soft, and also needs to be able to withstand large deformation. In such points, a piezoelectric element including PZT or PVDF is less advantageous. As a soft contact detection sensor, for example, a sensor utilizing contact charging has been proposed.

SUMMARY

In an aspect of the present disclosure, there is provided a sensor that includes a plurality of elements and an insulating layer. The plurality of elements is deformable to generate power. The insulating layer is interposed between the plurality of elements. Each of the plurality of elements includes a pair of electrodes and an intermediate layer. The intermediate layer is disposed between the pair of electrodes and formed of one of a rubber and a rubber composition.

In another aspect of the present disclosure, there is provided a sensor system that includes the sensor and a processor to process an output signal output from the sensor when an external force is applied to the sensor.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
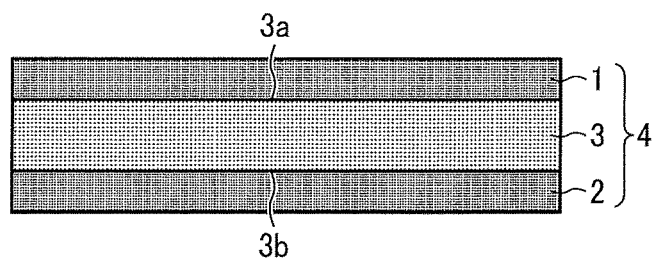
FIG. 1 is a side view illustrating a power generation element according to a first embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present disclosure. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Hereinafter, embodiments of the present disclosure will be described with reference to the drawings. In the embodiments, components having the same function and the same configuration are denoted by the same reference numerals, and redundant explanation is omitted appropriately. Components in the drawings may be partially omitted to facilitate understanding of the configurations.

First Embodiment

A first embodiment will be described with reference to FIGS. 1 and 2.

As illustrated in FIG. 1, a power generation element 4 which is an element includes a first electrode 1 and a second electrode 2 to form a pair of electrodes, and an intermediate layer 3 sandwiched between the first electrode 1 and the second electrode 2. For convenience, the first electrode 1 may be referred to as an upper electrode and the second electrode 2 may be referred to as a lower electrode.

The intermediate layer 3 is formed of a rubber or a rubber composition, and has been subjected to a surface modification treatment and/or an inactivation treatment such that one side 3a (side of the upper electrode in the present embodiment) in a lamination direction (thickness direction) has a different degree of deformation from the other side 3b (side of the lower electrode in the present embodiment) with respect to the same deformation imparting force (also referred to as external force) and a charge can be stored. This point will be described in detail below.

Figure 2:
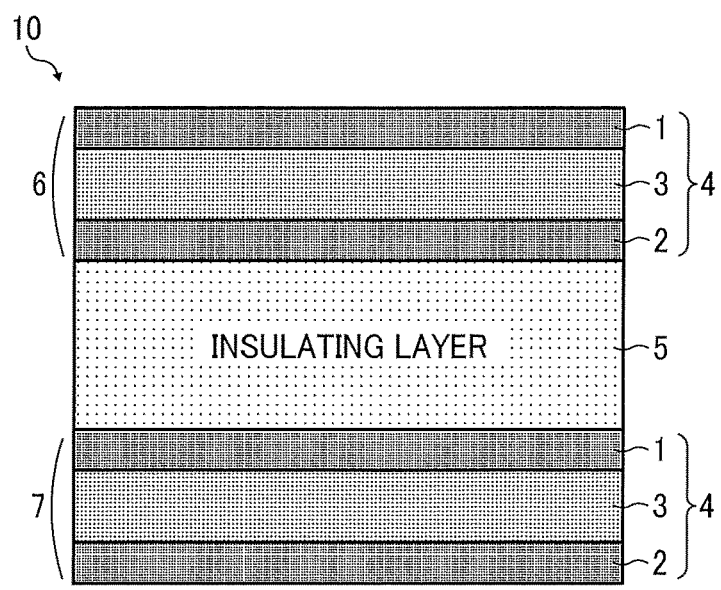
FIG. 2 is a side view illustrating a contact sensor according to the first embodiment of the present disclosure.

FIG. 2 illustrates a configuration of a sensor 10 using the power generation element 4 according to the present embodiment. The sensor 10 is constituted by laminating a plurality of the power generation elements 4 via an insulating layer 5. In the present embodiment, the insulating layer 5 is disposed between two of the power generation elements 4. In FIG. 2, the power generation element 4 disposed above the insulating layer 5 may be referred to as an upper layer power generation element 6, and the power generation element 4 disposed below the insulating layer 5 may be referred to as a lower layer power generation element 7.

The material, shape, size, thickness, and structure of the insulating layer 5 are not particularly limited, and can be appropriately selected according to a purpose.

Examples of the material of the insulating layer 5 include a polymer material and a rubber which is an elastic body.

Examples of the polymer material include polyethylene, polypropylene, polyethylene terephthalate, polyvinyl chloride, a polyimide resin, a fluorocarbon resin, and an acrylic resin.

Examples of the rubber include a silicone rubber, an acrylic rubber, a chloroprene rubber, a polysulfide rubber, a urethane rubber, a butyl rubber, a natural rubber, an ethylene-propylene rubber, a nitrile rubber, fluororubber, an isoprene rubber, a butadiene rubber, a styrene-butadiene rubber, an acrylonitrile-butadiene rubber, an ethylene-propylene-diene rubber, a chlorosulfonated polyethylene rubber, and polyisobutylene.

Second Embodiment

A second embodiment will be described with reference to FIGS. 3 and 4.

Figure 3:
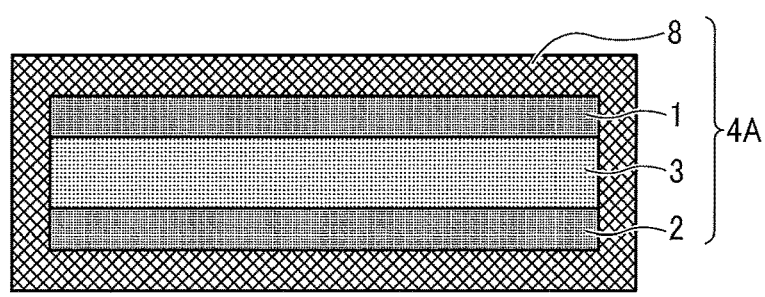
FIG. 3 is a side view illustrating a power generation element according to a second embodiment of the present disclosure.

As illustrated in FIG. 3, a power generation element 4A which is an element covers the power generation element described in the first embodiment with a cover 8. That is, the power generation element 4A includes a first electrode 1 and a second electrode 2 to form a pair of electrodes, an intermediate layer 3 sandwiched between the first electrode 1 and the second electrode 2, and the cover 8 covering the first electrode 1, the second electrode 2, and the intermediate layer 3.

The cover 8 is disposed mainly in order to protect the first electrode 1, the second electrode 2, and the intermediate layer 3. The material, shape, size, thickness, and structure of the cover 8 are not particularly limited, and can be appropriately selected according to a purpose.

Figure 4:
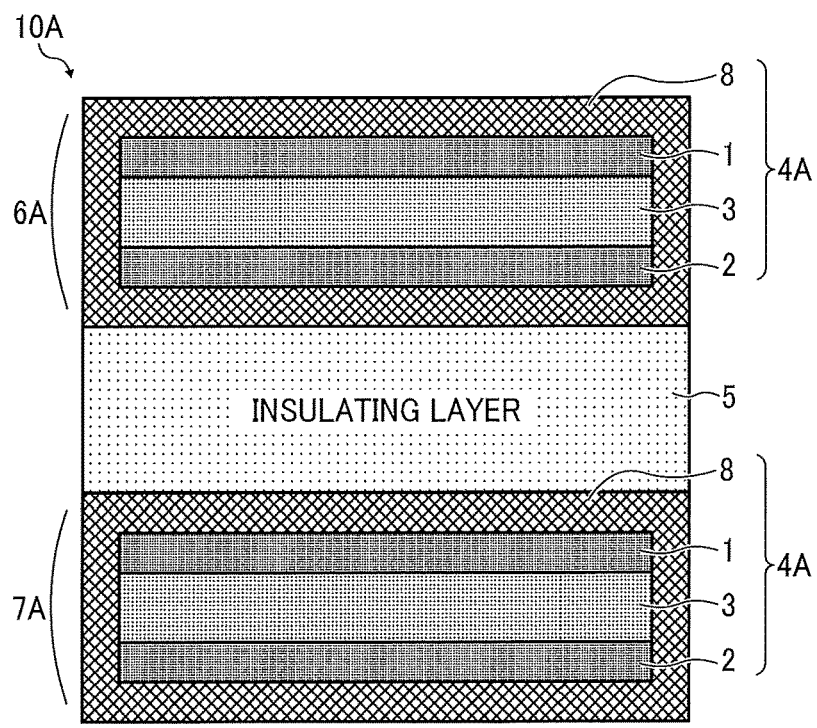
FIG. 4 is a side view illustrating a contact sensor according to the second embodiment of the present disclosure.

FIG. 4 illustrates a configuration of a sensor 10A using the power generation element 4A according to the present embodiment. The sensor 10A is constituted by laminating a plurality of the power generation elements 4A via an insulating layer 5. In the present embodiment, the insulating layer 5 is disposed between two of the power generation elements 4A. In FIG. 4, the power generation element 4A disposed above the insulating layer 5 may be referred to as an upper layer power generation element 6A, and the power generation element 4A disposed below the insulating layer 5 may be referred to as a lower layer power generation element 7A.

Third Embodiment

Figure 5:
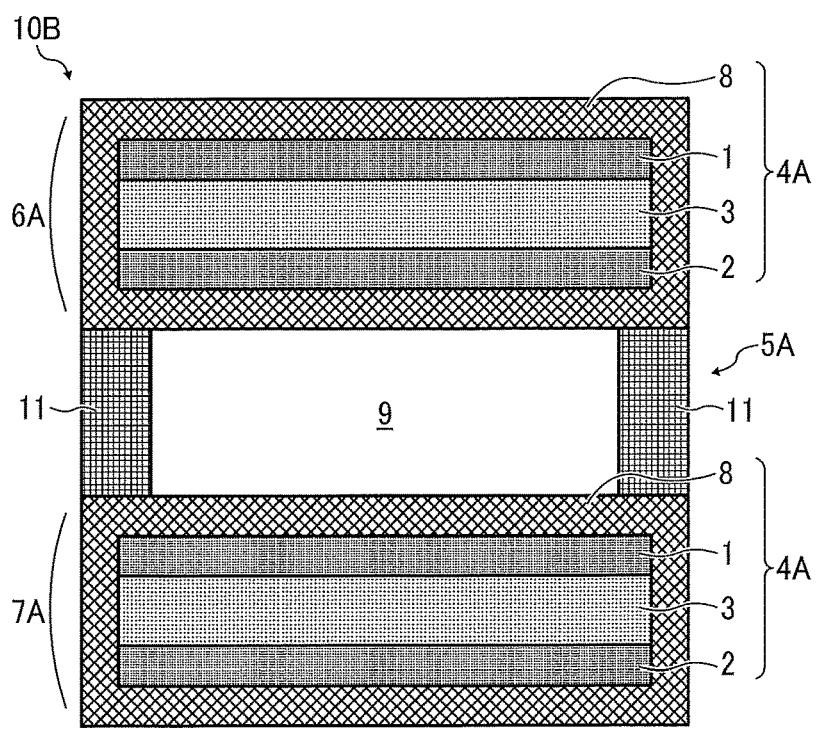
FIG. 5 is a side view illustrating a contact sensor according to a third embodiment of the present disclosure.

A third embodiment will be described with reference to FIG. 5.

A sensor 10B according to the present embodiment includes a support 11 disposed between a power generation element 4A and a power generation element 4A to form an air layer to form an insulating layer 5A. That is, the insulating layer 5A according to the present embodiment is formed of the support 11 disposed between a plurality of the power generation elements 4A and an air layer formed of a gap 9 generated by the support 11.

The material, form, shape, size, and the like of the support 11 are not particularly limited, and can be appropriately selected according to a purpose. Examples of the material of the support 11 include a polymer material, a rubber, a metal, a conductive polymer material, and a conductive rubber composition.

Examples of the polymer material include polyethylene, polypropylene, polyethylene terephthalate, polyvinyl chloride, a polyimide resin, a fluorocarbon resin, and an acrylic resin. Examples of the rubber include a silicone rubber, an acrylic rubber, a chloroprene rubber, a polysulfide rubber, a urethane rubber, a butyl rubber, a natural rubber, an ethylene-propylene rubber, a nitrile rubber, fluororubber, an isoprene rubber, a butadiene rubber, a styrene-butadiene rubber, an acrylonitrile-butadiene rubber, an ethylene-propylene-diene rubber, a chlorosulfonated polyethylene rubber, polyisobutylene, and modified silicone.

Examples of the metal include gold, silver, copper, aluminum, stainless steel, tantalum, nickel, and phosphor bronze. Examples of the conductive polymer material include polythiophene, polyacetylene, and polyaniline. Examples of the conductive rubber composition include a composition containing a conductive filler and a rubber. Examples of the conductive filler include a carbon material (for example, Ketjen black, acetylene black, graphite, carbon fiber, carbon nanofiber, carbon nanotube, or graphene), a metal (for example, gold, silver, platinum, copper, iron, aluminum, or nickel), a conductive polymer material (for example, a derivative of any one of polythiophene, polyacetylene, polyaniline, polypyrrole, polyparaphenylene, and polyparaphenylenevinylene, or a product obtained by adding a dopant represented by an anion or a cation to these derivatives), and an ionic liquid.

Examples of the rubber include a silicone rubber, an acrylic rubber, a chloroprene rubber, a polysulfide rubber, a urethane rubber, a butyl rubber, a natural rubber, an ethylene-propylene rubber, a nitrile rubber, fluororubber, an isoprene rubber, a butadiene rubber, a styrene-butadiene rubber, an acrylonitrile-butadiene rubber, an ethylene-propylene-diene rubber, a chlorosulfonated polyethylene rubber, polyisobutylene, and modified silicone.

Examples of a form of the support 11 include a sheet, a film, a woven fabric, a nonwoven fabric, a mesh, and a sponge.

The shape, size, thickness, and disposition place of the support 11 can be appropriately selected according to the structure of the element.

Fourth Embodiment

Figure 6:
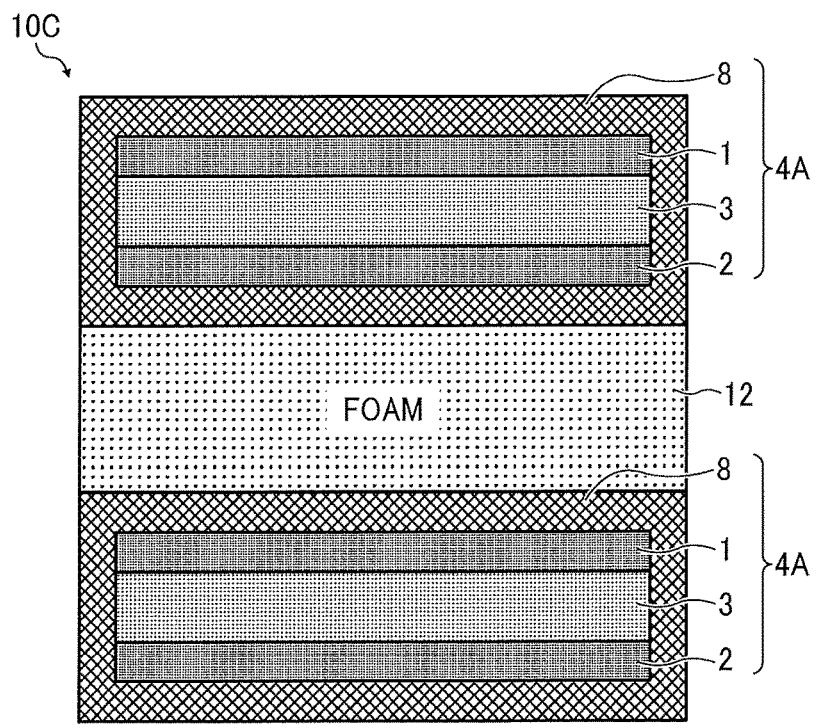
FIG. 6 is a side view illustrating a contact sensor according to a fourth embodiment of the present disclosure.

A fourth embodiment will be described with reference to FIG. 6.

A sensor 10C according to the present embodiment is constituted by disposing a foam 12 between a power generation element 4A and a power generation element 4A as an insulating layer and laminating the power generation element 4A and the foam 12.

The material, form, shape, size, and the like of the foam 12 are not particularly limited, and can be appropriately selected according to a purpose. Examples of the material of the foam include urethane, polyethylene, and silicone.

An evaluation result of a signal at the time of contact in the fourth embodiment will be described based on FIGS. 7 to 11.

Example 1

Hereinafter, Examples of the fourth embodiment will be described. The term "part" used herein represents "part by mass" unless otherwise specified. The term "%" used herein represents "% by mass" unless otherwise specified.

[Intermediate Layer]

As an intermediate layer 3, a silicone rubber which had been subjected to a surface modification treatment was manufactured.

With 100 parts of a silicone rubber (TSE 3033: manufactured by Momentive Performance Materials Inc.) as a base material, 40 parts of barium titanate (manufactured by Wako Pure Chemical Industries, Ltd., 93-5640) as an additive was mixed. The resulting mixture was subjected to blade coating on a PET (polyethylene terephthalate) film with an aim of an average thickness of 150±20 µm and length 40 mm×width 40 mm to obtain an intermediate layer precursor.

—Surface Modification Treatment—

The intermediate layer precursor was fired at about 120° C. for 30 minutes, and then was subjected to a plasma treatment as a surface modification treatment under the following conditions.

[Plasma Treatment Condition]
Apparatus: manufactured by Yamato Scientific Co., Ltd.: PR-500
Output: 100 W
Treatment time: 4 minutes
Reaction atmosphere: argon 99.999%
Reaction pressure: 10 Pa

[Electrode]

For electrodes 1 and 2, a nonwoven fabric conductive sheet (manufactured by Seiren, size 30 mm×30 mm) having an average thickness of 30 µm was used.

[Cover]

As a cover 8, a PET laminate film (manufactured by Fellows, size 50 mm×50 mm) having a thickness of 75 µm was used.

The intermediate layer 3 was sandwiched between the two electrodes 1 and 2, the resulting product was further sandwiched between the PET laminate films, and the resulting product was laminated at 80° C. to obtain the power generation element 4A.

[Insulating Layer]

For the insulating layer, urethane foam which was a foam (manufactured by Fuji Rubber Industry Co., Ltd., thickness: 2 cm) was used.

[Evaluation]

Figure 7:
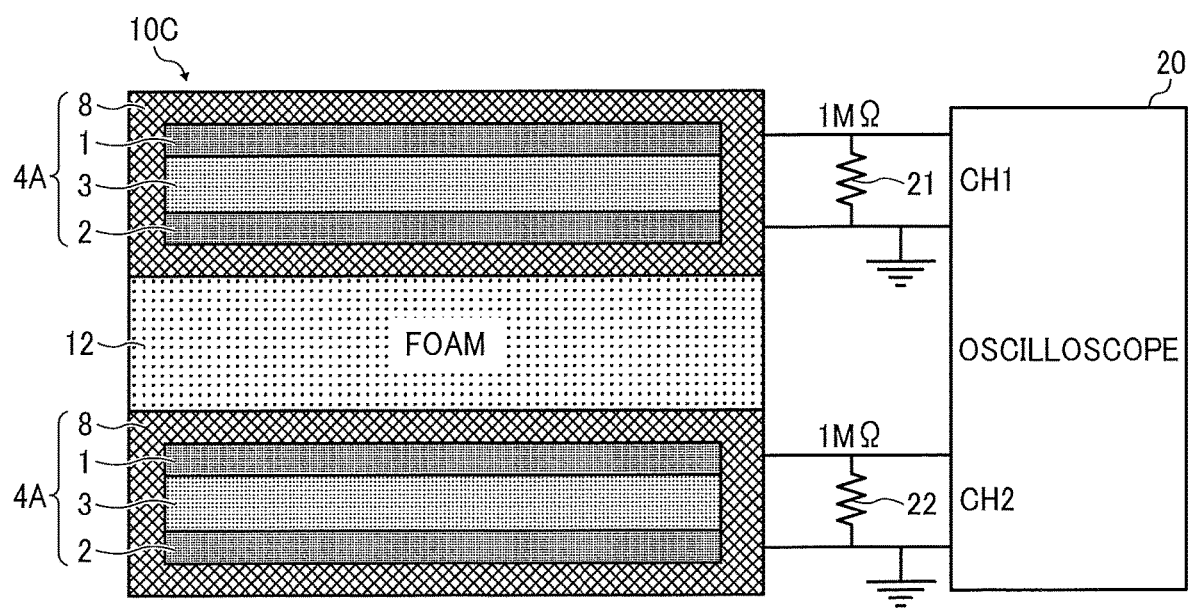
FIG. 7 is an evaluation configuration diagram of the contact sensor according to the fourth embodiment of the present disclosure.

FIG. 7 illustrates an evaluation configuration. Resistors 21 and 22 of 1 MΩ load are coupled between electrodes in the upper layer power generation element 6A and the lower layer power generation element 7A, respectively, and a voltage between the resistors is recorded with an oscilloscope 20.

Figure 8:
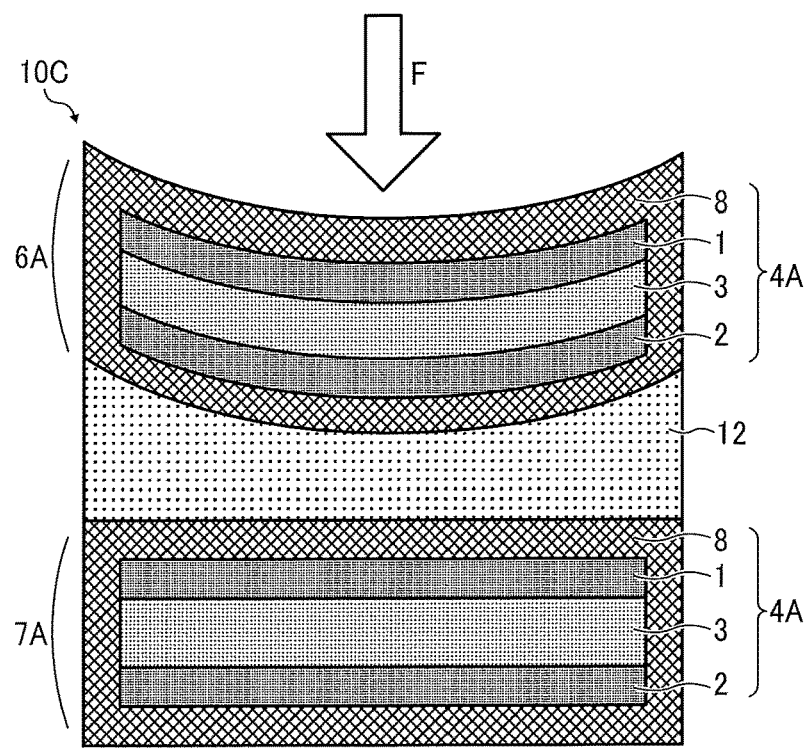
FIG. 8 is a schematic diagram illustrating deformation when a pressure is applied to the contact sensor according to the fourth embodiment of the present disclosure with a weak force.
Figure 9:
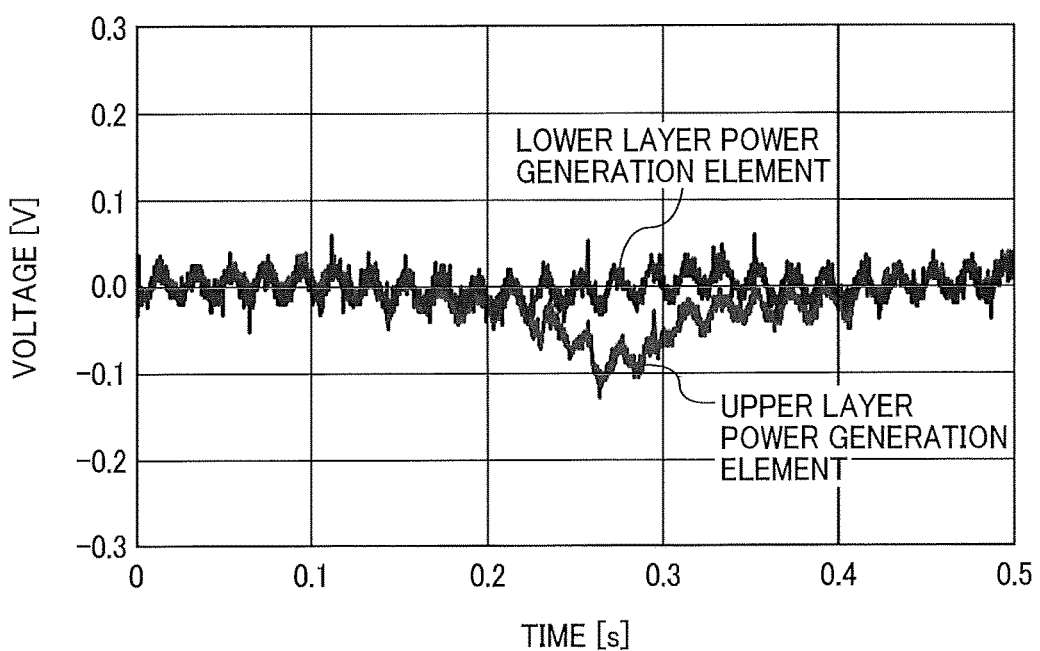
FIG. 9 (evaluation result of Example 1) is a voltage waveform diagram generated when a load is applied to the contact sensor according to the fourth embodiment of the present disclosure with a weak force.

FIG. 8 illustrates a schematic diagram of the sensor 10C when pressure F is applied from the side of the upper layer power generation element 6A with a weak force (5.7 kPa) like a stroking force. FIG. 9 illustrates signals generated at this time. In FIG. 9, the vertical axis indicates an output (voltage V) from each of the upper layer power generation element 6A and the lower layer power generation element 7A, and the horizontal axis indicates time (s).

As illustrated in FIG. 8, when a weak force is applied, only the upper layer power generation element 6A is deformed. Therefore, as illustrated in FIG. 9, only the upper layer power generation element 6A generates a signal, and the lower layer power generation element 7A generates no signal.

Figure 10:
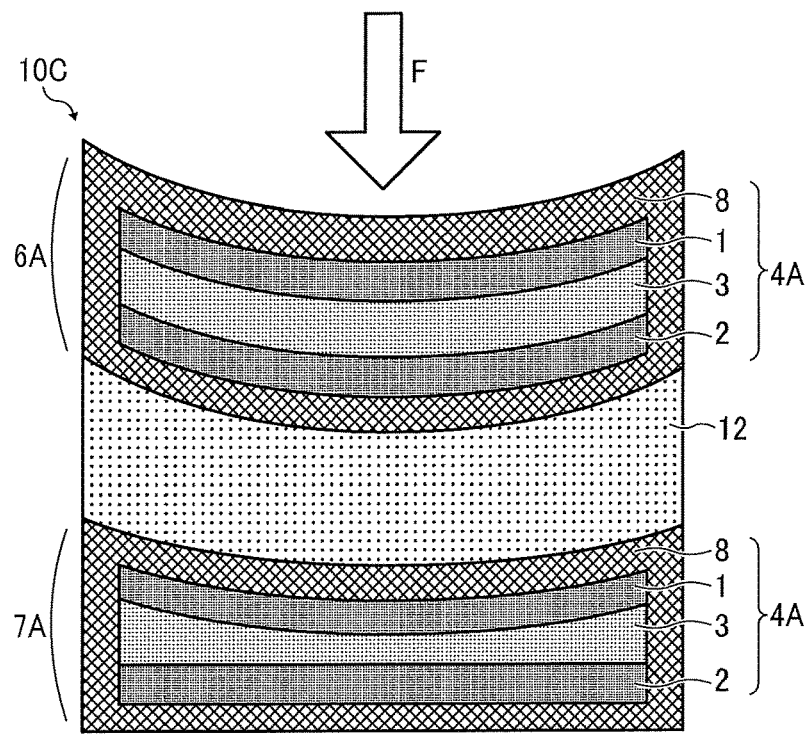
FIG. 10 is a schematic diagram illustrating deformation when a pressure is applied to the contact sensor according to the fourth embodiment of the present disclosure with a strong force.
Figure 11:
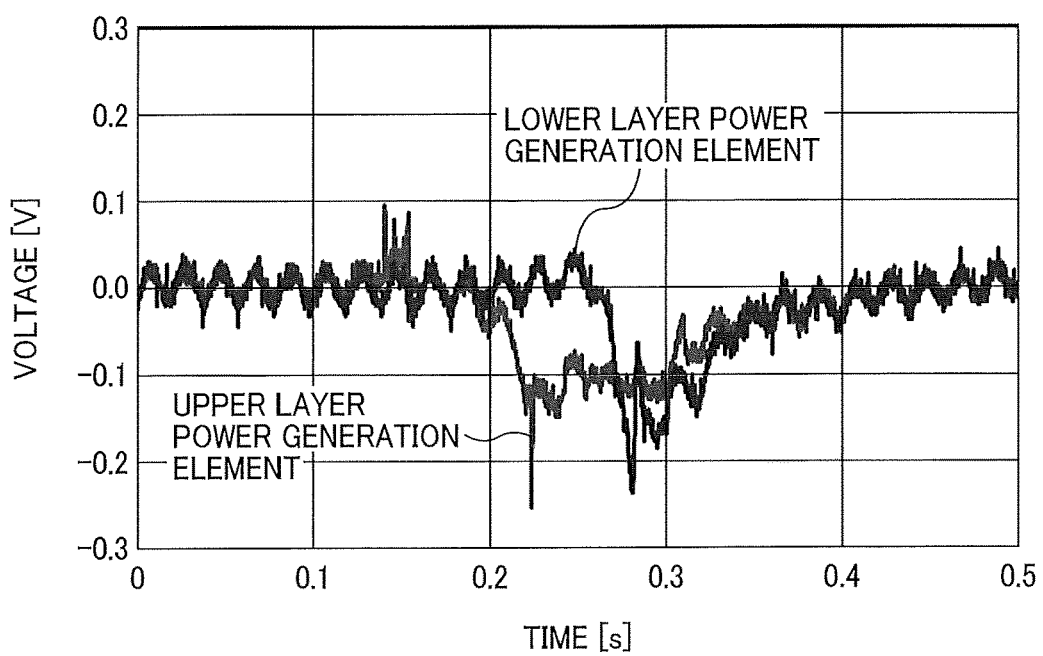
FIG. 11 (evaluation result of Example 1) is a voltage waveform diagram generated when a pressure is applied to the contact sensor according to the fourth embodiment of the present disclosure with a strong force.

Meanwhile, FIG. 10 illustrates a schematic diagram of the sensor 10C when the pressure F is applied from the side of the upper layer power generation element 6A with a strong force (57 kPa). FIG. 11 illustrates signals generated at this time. In FIG. 10, the vertical axis indicates an output (voltage V) from each of the upper layer power generation element 6A and the lower layer power generation element 7A, and the horizontal axis indicates time (s).

As illustrated in FIG. 10, when the pressure F is applied with a strong force, both the upper layer power generation element 6A and the lower layer power generation element 7A are deformed. Therefore, as illustrated in FIG. 11, both the power generation elements generate a signal.

From such an evaluation result, when the plurality of power generation elements 4 or 4A which includes the first electrode 1 and the second electrode 2 as a pair of electrodes and the intermediate layer 3 disposed between the first electrode 1 and the second electrode 2 and formed of a rubber or a rubber composition, and generates power by deformation is laminated via the insulating layer 5 or 5A (foam 12) to constitute the sensor 10, 10A, 10B, or 10C, deformation of the power generation elements 4 or 4A according to the pressure F is larger than deformation in a case of a single layer. Therefore, one sensor can detect the magnitude of the pressure F in multiple stages.

In addition, the power generation elements 4 and 4A have flexibility and the insulating layer 5 or 5A also has elasticity. Therefore, even when the power generation elements 4 or 4A are laminated, the lower layer power generation elements 7 or 7A can be deformed sufficiently according to the pressure F (load) applied to the sensor. Therefore, the magnitude of the pressure F can be more stably detected in multiple stages. Furthermore, the intermediate layer 3 is formed of a rubber or a rubber composition, and therefore has a large volume deformation ratio. An output from the power generation elements 4 or 4A is larger than a case of using a metal material, and detection can be performed more reliably.

In FIGS. 7 to 11, the power generation element 4A of the sensor 10C is illustrated as a two-layer structure, but the number of layers may be more than two. If the number of layers is increased, it is possible to increase a gradation property for determining strength of a force by that amount.

Fifth Embodiment

A sensor system 100 according to a fifth embodiment will be described with reference to FIG. 12.

Figure 12:
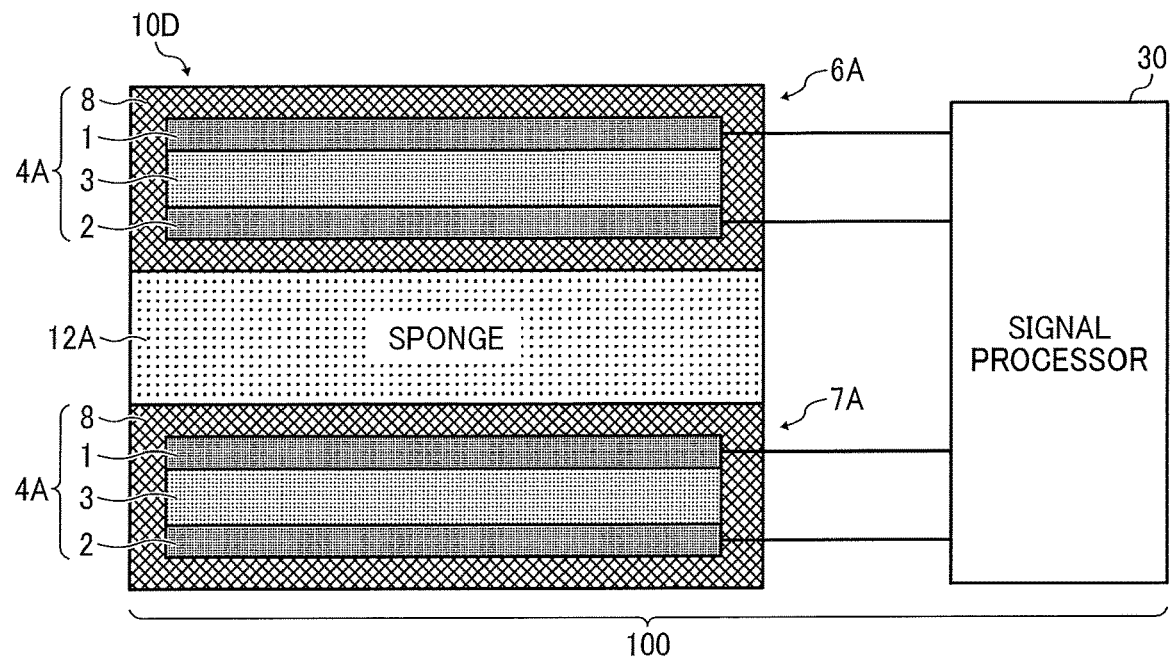
FIG. 12 is a side view illustrating a contact detection system according to a fifth embodiment of the present disclosure.

As illustrated in FIG. 12, the sensor system 100 according to the present embodiment uses a sponge 12A as a foam (elastic body) which is an insulator and constitutes an intermediate layer, and includes a sensor 10D including two power generation elements 4A and 4A laminated via the sponge 12A, and a processor (hereinafter, referred to as a "signal processor") 30 to process an output signal output from the sensor 10D (power generation elements 4A and 4A) when a pressure F as an external force is applied to the sensor 10D. In FIG. 12, the power generation element 4A located above the sponge 12A is the upper layer power generation element 6A, and the power generation element 4A located below the sponge 12A is the lower layer power generation element 7A.

The signal processor 30 is coupled to the power generation elements 4A and 4A (sensor 10 D) via a signal line. The signal processor 30 is not particularly limited as long as having an input terminal to take in an output signal of each of the power generation elements 4A and 4A and being able to process the output signal of each of the power generation elements 4A and 4A, and can be appropriately selected according to a purpose.

The sensor 10D outputs a signal (voltage) according to the pressure F in multiple stages. Therefore, the sensor 10D may be disposed on a surface of a robot or the like, and may be used for determination of an object in contact with the surface. Alternatively, the sensor 10D may be attached to a vehicle, and may be used for detection when an object is in contact or collides with the vehicle.

Figure 18:
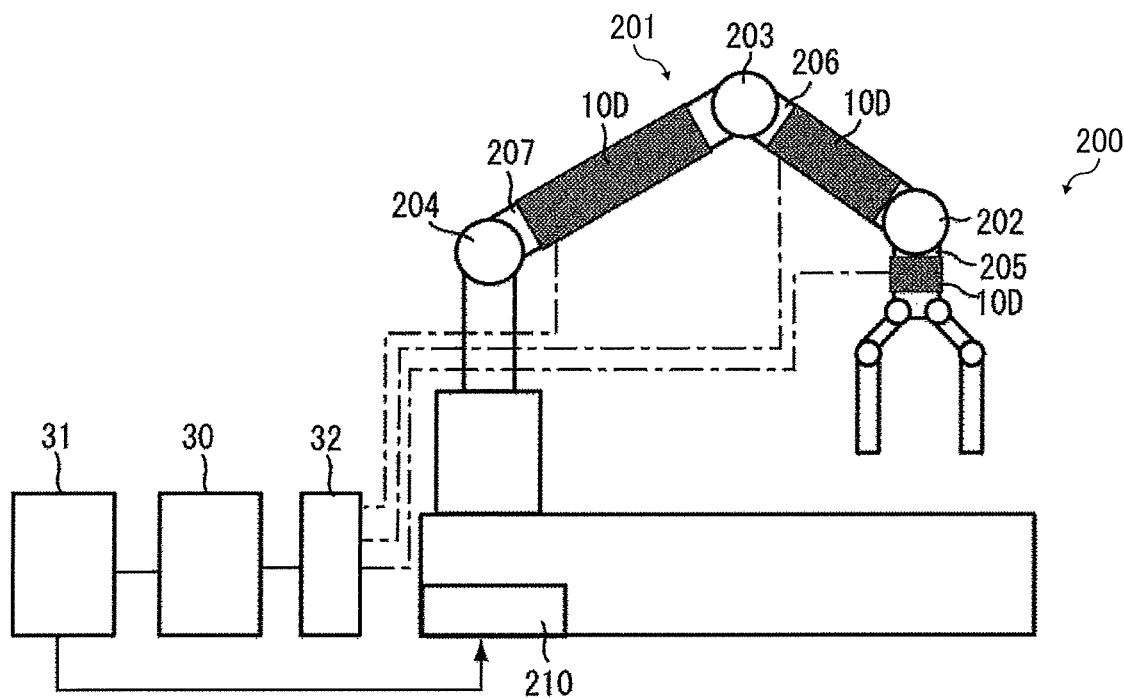
FIG. 18 is a view for describing one form adopting the contact detection system described in the fifth embodiment.

FIG. 18 illustrates a form in which the above sensor system is applied to a robot arm device 200.

In FIG. 18, the robot arm device 200 includes an articulated robot arm 201 and an arm control unit 210 to control operation of the robot arm 201. By gripping a workpiece at a predetermined position and releasing the workpiece at a different position, the robot arm 201 performs a workpiece conveyance process. The operation of the robot arm 201 is performed by control of operation of an arm drive source by the arm control unit 210.

At a place where the robot arm device 200 is disposed, a person is prohibited from entering an operation area of the robot arm 201. However, at the time of maintenance, a person may enter the operation area to perform work, or a person may enter the operation area erroneously. When a plurality of robot arm devices 200 is disposed so as to be adjacent to each other, it is necessary to consider contact (interference) between the robot arms.

Therefore, in the robot arm device 200, the sensor 10D is disposed around the robot arm 201. Specifically, the sensors 10D are attached to surfaces of arm rods 205, 206, and 207 coupled to joint portions 202, 203, and 204 of the robot arm 201, respectively. In the present embodiment, the sensor 10D has flexibility, and therefore is attached to each of the surfaces of the arm rods 205 to 207 so as to be wound around each of the surfaces of the arm rods 205 to 207. Each sensor 10D is coupled to the signal processor 30 via a rectifying circuit 32.

The signal processor 30 is coupled to a determiner 31 to determine the type of an object in contact with the robot arm 201 based on the output of each sensor 10D which has been signal-processed by the signal processor 30 via a signal line. The determiner 31 is constituted by a computer including a central processing unit (CPU), a read only memory (ROM), a random access memory (RAM), and the like. A determination result of the determiner 31 is sent to the arm control unit 210 and is fed back to operation control of the robot arm 201.

A determination value for determining an object or a state in contact with the robot arm 201 is set in the determiner 31. By comparing the determination value with the output signal sent from the signal processor 30, the determiner 31 determines an object in contact with the robot arm 201 or presence of a person close to the robot arm 201. In a case of the configuration of FIG. 18, a contact target includes a person (human body) and an object other than a person. Note that the term "contact" used herein includes not only direct contact with the sensor 10D but also indirect contact with the sensor 10D via a protective layer in a case where the protective layer is disposed outside the sensor 10D.

That is, the sensor 10D includes the intermediate layer formed of an elastic body such as a soft rubber or the sponge 12A, and therefore can detect a fine movement of a human body including a human pulsation. The lower layer power generation element 7A is deformed via the upper layer power generation element 6A. As a result, a pressure change or the like larger than a fine movement can be selectively detected. Therefore, by setting a determination value matching a detection target and comparing a value of a detected fine movement with the determination value, a movement of a person or an object can be determined. That is, the determiner 31 acquires information on a fine movement including a pulsation of a human body, and determines presence of a person based on the acquired information on the fine movement.

A threshold of a contact state (present state) for stopping the robot arm 201, such as "a light contact between the robot arms does not stop the robot arm device 200 but causes avoidance operation", "a strong contact between the robot arms causes immediate stop", or "all kinds of contact with a person (detection of presence of a person) causes immediate stop" can be determined stepwisely, resulting in contribution to improvement of productivity while operational safety of the robot arm device 200 is secured.

Figure 19:
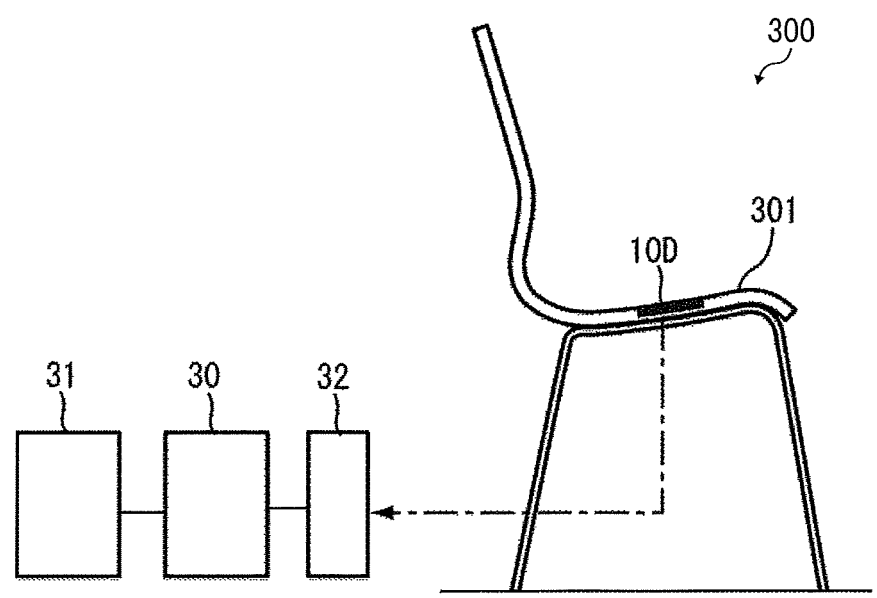
FIG. 19 is a view for describing another form adopting the contact detection system described in the fifth embodiment.

As illustrated in FIG. 19, the sensor 10D may be disposed such that the buttocks of a person are located near the sensor 10D when the person sits on a seating portion 301 of a chair 300. Even in this case, as described in FIG. 18, the sensor 10D is coupled to the signal processor 30 via the rectifying circuit 32, and the signal processor 30 takes in an output signal from the sensor 10D. The determiner 31 is coupled to the signal processor 30 via a signal line, and determines a contact target according to the output from each sensor 10D. That is, the determiner 31 acquires information on a fine movement including a pulsation of a human body, and determines presence of a person based on the acquired information on the fine movement.

In a case of applying the sensor system to the chair 300 as in the configuration of FIG. 19, by comparing a preset determination value with an output signal sent from the signal processor 30, the determiner 31 determines an object in contact with or close to the sensor 10D on the seating portion 301. This contact target includes a person (human body) and an object other than a person. A state to be detected includes two states of "presence of person (contact state)" and "discrimination between a person and an object".

That is, the sensor 10D includes the intermediate layer formed of an elastic body such as a soft rubber or the sponge 12A, and therefore can detect a fine movement of a human body including a human pulsation. The lower layer power generation element 7A is deformed via the upper layer power generation element 6A. As a result, a pressure change or the like larger than a fine movement can be selectively detected. Therefore, by setting a determination value matching a detection target and comparing a value of a detected fine movement with the determination value, a movement of a person or an object can be determined, and a change in the center of gravity or a change in load when a person sits can be detected. That is, the determiner 31 determines presence of a person and movement of a person due to a change in pressure separately from each other, based on an output signal output from the sensor 10D. The term "contact" used herein includes not only direct contact of the buttocks with the sensor 10D but also indirect contact of the buttocks with the sensor 10D via a skin material of the seating portion 301 or a cushion material.

In FIGS. 18 and 19, the signal processor 30, the determiner 31, and the rectifying circuit 32 have been described as separate components, but the determiner 31 and the rectifying circuit 32 may be incorporated in the signal processor 30. The rectifying circuit 32 may be disposed in the sensor itself.

In each of the above embodiments, as the intermediate layer 3, a silicone rubber which has been subjected to a surface modification treatment and an inactivation treatment is used. When a silicone rubber is subjected to the surface modification treatment, the side of the first electrode (side of the upper electrode) 3a of the intermediate layer has a different degree of deformation from the side of the second electrode (side of the lower electrode) 3b with respect to the same deformation imparting force. That is, both sides have different hardnesses from each other. This characteristic improves power generation efficiency.

Hereinafter, materials and the like of an electrode and an intermediate layer for exhibiting the above characteristics will be described in detail.

[First Electrode and Second Electrode]

The material, shape, size, and structure of each of the first electrode and the second electrode are not particularly limited, and can be appropriately selected according to a purpose.

The material, shape, size, and structure of the first electrode may be the same as or different from the material, shape, size, and structure of the second electrode, but are preferably the same.

Examples of the material of each of the first electrode and the second electrode include a metal, a carbon-based conductive material, a conductive rubber composition, a conductive polymer, and an oxide.

Examples of the metal include gold, silver, copper, aluminum, stainless steel, tantalum, nickel, and phosphor bronze. Examples of the carbon-based conductive material include carbon nanotube, carbon fiber, and graphite. Examples of the conductive rubber composition include a composition containing a conductive filler and a rubber. Examples of the conductive polymer include polyethylene dioxythiophene (PEDOT), polypyrrole, and polyaniline. Examples of the oxide include indium tin oxide (ITO), indium oxide-zinc oxide (IZO), and zinc oxide.

Examples of the conductive filler include a carbon material (for example, Ketjen black, acetylene black, graphite, carbon fiber (CF), carbon nanofiber (CNF), carbon nanotube (CNT), or graphene), a metal filler (gold, silver, platinum, copper, aluminum, nickel, or the like), a conductive polymer material (a derivative of any one of polythiophene, polyacetylene, polyaniline, polypyrrole, polyparaphenylene, and polyparaphenylenevinylene, a product obtained by adding a dopant represented by an anion or a cation to these derivatives, or the like), and an ionic liquid. These materials may be used singly or in combination of two or more kinds of the materials.

Examples of the rubber include a silicone rubber, an acrylic rubber, a chloroprene rubber, a polysulfide rubber, a urethane rubber, a butyl rubber, a natural rubber, an ethylene-propylene rubber, a nitrile rubber, fluororubber, an isoprene rubber, a butadiene rubber, a styrene-butadiene rubber, an acrylonitrile-butadiene rubber, an ethylene-propylene-diene rubber, a chlorosulfonated polyethylene rubber, polyisobutylene, and modified silicone. These materials may be used singly or in combination of two or more kinds of the materials.

Examples of the shapes of the first electrode and the second electrode include a thin film. Examples of the structures of the first electrode and the second electrode include a nonwoven fabric formed by overlapping a woven fabric, a nonwoven fabric, a knitted fabric, a mesh, a sponge, and a fibrous carbon material.

The average thickness of the electrode is not particularly limited, and can be appropriately selected according to a purpose, but is preferably 0.01 µm to 1 mm and more preferably 0.1 µm to 500 µm from a viewpoints of conductivity and flexibility. The average thickness of 0.01 µm or more makes mechanical strength appropriate and improves conductivity. The average thickness of 1 mm or less makes it possible to deform the element, and makes power generation performance good.

[Intermediate Layer]

The intermediate layer has flexibility.

The intermediate layer satisfies at least one of the following conditions (1) and (2).

Condition (1): When the intermediate layer is pressed from a direction orthogonal to a surface of the intermediate layer, the amount of deformation on the side of the first electrode (one side) of the intermediate layer is different from the amount of deformation on the side of the second electrode (the other side).

Condition (2): The universal hardness (H1) at the time of indentation depth of 10 µm at the side of the first electrode of the intermediate layer is different from the universal hardness (H2) at the time of indentation depth of 10 µm at the side of the second electrode of the intermediate layer.

In the intermediate layer, as described above, a large amount of power generation can be obtained due to the difference in deformation amount or hardness between both surfaces.

In the present disclosure, the deformation amount is the maximum indentation depth of an indenter when the intermediate layer is pressed under the following conditions.

{Measurement Condition}

Measuring machine: manufactured by Fischer Co., ultra-micro hardness meter WIN-HUD Indenter: Quadrangular pyramid diamond indenter with face-to-face angle of 136°

Initial load: 0.02 mN

Maximum load: 1 mN

Load increase time from initial load to maximum load: 10 seconds

Universal hardness is determined by the following method.

{Measurement Condition}

Measuring machine: manufactured by Fischer Co., ultra-micro hardness meter WIN-HUD Indenter: Quadrangular pyramid diamond indenter with face-to-face angle of 136°

Indentation depth: 10 μm

Initial load: 0.02 mN

Maximum load: 100 mN

Load increase time from initial load to maximum load: 50 seconds

A ratio (H1/H2) between universal hardness (H1) and universal hardness (H2) is preferably 1.01 or more, more preferably 1.07 or more, and particularly preferably 1.13 or more. An upper limit value of the ratio (H1/H2) is not particularly limited and can be appropriately selected according to the degree of flexibility required in a use state, a load in the use state, and the like, but is preferably 1.70 or less. Herein, H1 represents a universal hardness of a relatively hard surface, and H2 represents a universal hardness of a relatively soft surface.

A material of the intermediate layer is not particularly limited, and can be appropriately selected according to a purpose. Examples of the material include a rubber and a rubber composition. Examples of the rubber include a silicone rubber, an acrylic rubber, a chloroprene rubber, a polysulfide rubber, a urethane rubber, a butyl rubber, a natural rubber, an ethylene-propylene rubber, a nitrile rubber, fluororubber, an isoprene rubber, a butadiene rubber, a styrene-butadiene rubber, an acrylonitrile-butadiene rubber, an ethylene-propylene-diene rubber, a chlorosulfonated polyethylene rubber, polyisobutylene, and modified silicone. These materials may be used singly or in combination of two or more kinds of the materials. Among these materials, a silicone rubber is preferable.

The silicone rubber is not particularly limited as long as being a rubber having a siloxane bond, and can be appropriately selected according to a purpose. Examples of the silicone rubber include a dimethyl silicone rubber, a methyl phenyl silicone rubber, a fluorosilicone rubber, and a modified silicone rubber (for example, acrylic modified, alkyd modified, ester modified, or epoxy modified). These materials may be used singly or in combination of two or more kinds of the materials.

Examples of the rubber composition include a composition containing a filler and the rubber. Among these materials, a silicone rubber composition containing the silicone rubber is preferable because of high power generation performance.

Examples of the filler include an organic filler, an inorganic filler, and an organic-inorganic composite filler. The organic filler is not particularly limited as long as being an organic compound, and can be appropriately selected according to a purpose. Examples of the organic filler include acrylic fine particles, polystyrene fine particles, melamine fine particles, fluorocarbon resin fine particles such as polytetrafluoroethylene, silicone powder (silicone resin powder, silicone rubber powder, or silicone composite powder), rubber powder, wood powder, pulp, and starch. The inorganic filler is not particularly limited as long as being an inorganic compound, and can be appropriately selected according to a purpose.

Examples of the inorganic filler include an oxide, a hydroxide, a carbonate, a sulfate, a silicate, a nitride, a carbon, a metal, and other compounds.

Examples of the oxide include silica, diatomaceous earth, alumina, zinc oxide, titanium oxide, iron oxide, and magnesium oxide.

Examples of the hydroxide include aluminum hydroxide, calcium hydroxide, and magnesium hydroxide.

Examples of the carbonate include calcium carbonate, magnesium carbonate, barium carbonate, and hydrotalcite.

Examples of the sulfate include aluminum sulfate, calcium sulfate, and barium sulfate.

Examples of the silicate include calcium silicate (wollastonite or zonotolite), zircon silicate, kaolin, talc, mica, zeolite, perlite, bentonite, montmorinote, sericite, activated clay, glass, and hollow glass beads.

Examples of the nitride include aluminum nitride, silicon nitride, and boron nitride.

Examples of the carbon include Ketjen black, acetylene black, graphite, carbon fiber, carbon nanofiber, carbon nanotube, fullerene (including derivatives), and graphene.

Examples of the metal include gold, silver, platinum, copper, iron, aluminum, and nickel.

Examples of the other compounds include potassium titanate, barium titanate, strontium titanate, lead zirconate titanate, silicon carbide, and molybdenum sulfide. Note that the inorganic filler may be subjected to a surface treatment.

The organic-inorganic composite filler is not particularly limited and can be used as long as being a compound obtained by combining an organic compound and an inorganic compound at a molecular level.

Examples of the organic-inorganic composite filler include silica-acrylic composite fine particles and silsesquioxane.

The average particle diameter of the filler is not particularly limited, and can be appropriately selected according to a purpose, but is preferably 0.01 μm to 30 μm, and more preferably 0.1 μm to 10 μm. The average particle diameter of 0.01 μm or more may improve power generation performance. The average particle diameter of 30 μm or less makes it possible to deform the intermediate layer and to increase power generation performance.

The average particle diameter can be measured according to a known method using a known particle size distribution measuring apparatus, for example, Microtrac HRA (manufactured by Nikkiso Co., Ltd.).

The content of the filler is preferably 0.1 parts by mass to 100 parts by mass, and more preferably 1 part by mass to 50 parts by mass with respect to 100 parts by mass of a rubber. The content of 0.1 parts by mass or more may improve power generation performance. The content of 100 parts by mass or less makes it possible to deform the intermediate layer and to increase power generation performance.

The other components are not particularly limited, and can be appropriately selected according to a purpose. Examples of the other components include an additive. The content of the other components can be appropriately selected within a range not impairing the object of the present disclosure.

Examples of the additive include a crosslinking agent, a reaction control agent, a filler, a reinforcing material, an antioxidant, a conductivity control agent, a colorant, a plasticizer, a processing aid, a flame retardant, an ultraviolet absorber, a tackifier, and a thixotropic agent.

A method for preparing a material constituting the intermediate layer is not particularly limited, and can be appropriately selected according to a purpose. For example, as the method of preparing the rubber composition, the rubber composition can be prepared by mixing the rubber, the filler, and further the other components, if necessary, and kneading and dispersing the resulting mixture.

A method for forming the intermediate layer is not particularly limited, and can be appropriately selected according to a purpose. Examples of a method for forming a thin film of the rubber composition include a method for applying the rubber composition onto a base material by blade coating, die coating, dip coating, or the like, and then curing the rubber composition by heat, an electron beam, or the like.

The average thickness of the intermediate layer is not particularly limited, and can be appropriately selected according to a purpose, but is preferably 1 μm to 10 mm and more preferably 20 μm to 1 mm from a viewpoint of deformation followability. The average thickness within the preferable range makes it possible to secure a film formation property, and does not inhibit deformation. Therefore, good power generation can be performed.

The intermediate layer preferably has an insulating property. As the insulating property, it is preferable to have a volume resistivity of $10^8$ Ωcm or more, and more preferably have a volume resistivity of $10^{10}$ Ωcm or more. The intermediate layer may have a multilayer structure.

(Surface Modification Treatment and Inactivation Treatment)

Examples of a method for making the amount of deformation or hardness different between both surfaces in the intermediate layer include a surface modification treatment and an inactivation treatment. Both of these treatments may be performed, or only one of these treatments may be performed.

<Surface Modification Treatment>

Examples of the surface modification treatment include a plasma treatment, a corona discharge treatment, an electron beam irradiation treatment, an ultraviolet irradiation treatment, an ozone treatment, and a radiation (X ray, a ray, (3 ray, y ray, or neutron beam) irradiation treatment. Among these treatments, the plasma treatment, the corona discharge treatment, and the electron beam irradiation treatment are preferable from a viewpoint of a treatment speed. However, the surface modification treatment is not limited thereto as long as having a certain degree of irradiation energy and being able to modify a material.

<<Plasma Treatment>>

In a case of the plasma treatment, for example, an atmospheric pressure plasma apparatus can be used as a plasma generator in addition to a parallel plate type, a capacity coupling type, and an inductive coupling type. A reduced pressure plasma treatment is preferable from a viewpoint of durability.

A reaction pressure in the plasma treatment is not particularly limited, and can be appropriately selected according to a purpose, but is preferably 0.05 Pa to 100 Pa, and more preferably 1 Pa to 20 Pa.

A reaction atmosphere in the plasma treatment is not particularly limited, and can be appropriately selected according to a purpose. For example, a gas such as an inert gas, a rare gas, or oxygen is effective, but argon is preferable in view of persistence of an effect.

In this case, it is preferable to set an oxygen partial pressure to 5,000 ppm or less. An oxygen partial pressure of 5,000 ppm or less in the reaction atmosphere makes it possible to suppress generation of ozone and to prevent use of an ozone treatment apparatus.

The irradiation power amount in the plasma treatment is defined by (output×irradiation time). The irradiation power amount is preferably 5 Wh to 200 Wh, and more preferably 10 Wh to 50 Wh. The irradiation power amount within the preferable range makes it possible to impart a power generation function to the intermediate layer, and does not lower durability due to excessive irradiation.

<<Corona Discharge Treatment>>

Applied energy (cumulative energy) in the corona discharge treatment is preferably 6 $J/cm^2$ to 300 $J/cm^2$, and more preferably 12 $J/cm^2$ to 60 $J/cm^2$. Applied energy within the preferable range makes it possible to impart a power generation function to the intermediate layer, and does not lower durability due to excessive irradiation.

<<Electron Beam Irradiation Treatment>>

The irradiation amount in the electron beam irradiation treatment is preferably 1 kGy or more, and more preferably 300 kGy to 10 MGy. The irradiation amount within the preferable range makes it possible to impart a power generation function to the intermediate layer, and does not lower durability due to excessive irradiation.

A reaction atmosphere in the electron beam irradiation treatment is not particularly limited, and can be appropriately selected according to a purpose. However, it is preferable to fill the atmosphere with an inert gas such as argon, neon, helium, or nitrogen and to set an oxygen partial pressure to 5,000 ppm or less. An oxygen partial pressure of 5,000 ppm or less in the reaction atmosphere makes it possible to suppress generation of ozone and to prevent use of an ozone treatment apparatus.

<<Ultraviolet Irradiation Treatment>>

An ultraviolet ray in the ultraviolet irradiation treatment preferably has a wavelength of 365 nm or less and 200 nm or more, and more preferably has a wavelength of 320 nm or less and 240 nm or more.

The cumulative light amount in the ultraviolet irradiation treatment is preferably 5 $J/cm^2$ to 500 $J/cm^2$, and more preferably 50 $J/cm^2$ to 400 $J/cm^2$. The cumulative light amount within the preferable range makes it possible to impart a power generation function to the intermediate layer, and does not lower durability due to excessive irradiation.

A reaction atmosphere in the ultraviolet irradiation treatment is not particularly limited, and can be appropriately selected according to a purpose. However, it is preferable to fill the atmosphere with an inert gas such as argon, neon, helium, or nitrogen and to set an oxygen partial pressure to 5,000 ppm or less. An oxygen partial pressure of 5,000 ppm or less in the reaction atmosphere makes it possible to suppress generation of ozone and to prevent use of an ozone treatment apparatus.

As related art, it has been proposed to form an active group by excitation or oxidation by a plasma treatment, a corona discharge treatment, an ultraviolet irradiation treatment, an electron beam irradiation treatment, or the like to increase interlayer adhesion. However, the technique is limited to application to an interlayer portion, and it is known that application to an outermost surface is rather unfavorable because of reduction in releasability. A reaction is performed in an oxygen-rich state, and a reactive active group (hydroxyl group) is effectively introduced. Therefore, such related art is essentially different from the surface modification treatment of the present disclosure.

The surface modification treatment of the present disclosure promotes re-crosslinking and bonding on a surface due to a treatment (for example, a plasma treatment) in a reaction environment with a small amount of oxygen under a reduced pressure, and improves durability, for example, due to "increase in Si—O bond with high bond energy".

In addition, it is considered that releasability is improved due to "densification by improvement in crosslinking density". Note that some active groups are formed also in the present disclosure, but the active groups are inactivated by a coupling agent or an air drying treatment described below.

<Inactivation Treatment>

A surface of the intermediate layer may be subjected to an inactivation treatment appropriately using various materials.

The inactivation treatment is not particularly limited as long as being a treatment for inactivating a surface of the intermediate layer, and can be appropriately selected according to a purpose. Examples of the inactivation treatment include a treatment for applying an inactivating agent to the surface of the intermediate layer. Inactivation means changing the surface of the intermediate layer so as to have a property hardly causing a chemical reaction. This change is obtained by causing an active group (for example, —OH) generated by excitation or oxidation by a plasma treatment, a corona discharge treatment, an ultraviolet irradiation treatment, an electron beam irradiation treatment, or the like to react with an inactivating agent and decreasing activity on the surface of the intermediate layer.

Examples of the inactivating agent include an amorphous resin and a coupling agent. Examples of the amorphous resin include a resin having a perfluoropolyether structure in a main chain.

Examples of the coupling agent include a solution containing a metal alkoxide or a metal alkoxide.

Examples of the metal alkoxide include a compound represented by the following general formula (1), a partial hydrolysis polycondensate of the compound represented by the following general formula (1), having a degree of polymerization of about 2 to 10, and a mixture of the compound represented by the following general formula (1) and the partial hydrolysis polycondensate.

general formula (1)

However, in general formula (1), $R^1$ and $R^2$ each independently represent any one of a straight chain or branched alkyl group having 1 to 10 carbon atoms, an alkyl polyether chain, and an aryl group, and n represents an integer of 2 to 4.

The inactivation treatment can be performed, for example, by subjecting an intermediate layer precursor such as a rubber to the surface modification treatment and then impregnating a surface of the intermediate layer precursor with an inactivating agent by coating, dipping, or the like.

In a case of using a silicone rubber as the intermediate layer precursor, inactivation may be performed by subjecting the silicone rubber to the surface modification treatment, then allowing the resulting silicone rubber to stand in the air, and air-drying the silicone rubber.

A profile of an oxygen concentration in a thickness direction of the intermediate layer preferably has a local maximum value. A profile of a carbon concentration in the thickness direction of the intermediate layer preferably has a local minimum value.

In the intermediate layer, a position indicating a local maximum value of the profile of the oxygen concentration more preferably coincides with a position indicating a local minimum value of the profile of the carbon concentration.

The profile of the oxygen concentration and the profile of the carbon concentration can be determined by X-ray photoelectron spectroscopy (XPS).

Examples of the measuring method include the following methods.

{Measuring Method}

Measuring apparatus: Ulvac-PHI Quantera SXM, manufactured by ULVAC PHI, Inc.

Measurement light source: Al (mono)

Measurement output: 100 μm φ, 25.1 W

Measurement area: 500 μm×300 μm

Path energy: 55 eV (narrow scan)

Energy step: 0.1 eV (narrow scan)

Relative sensitivity coefficient: use of relative sensitivity coefficient of PHI Sputtering source: C60 cluster ion Ion gun output: 10 kV, 10 nA Raster Control: (X=0.5, Y=2.0) mm Sputtering rate: 0.9 nm/min (in terms of $SiO_2$)

In XPS, it is possible to know an existence concentration ratio of atoms in an object to be measured and a bonding state by capturing electrons that jump out due to a photoelectron effect.

Figure 13:
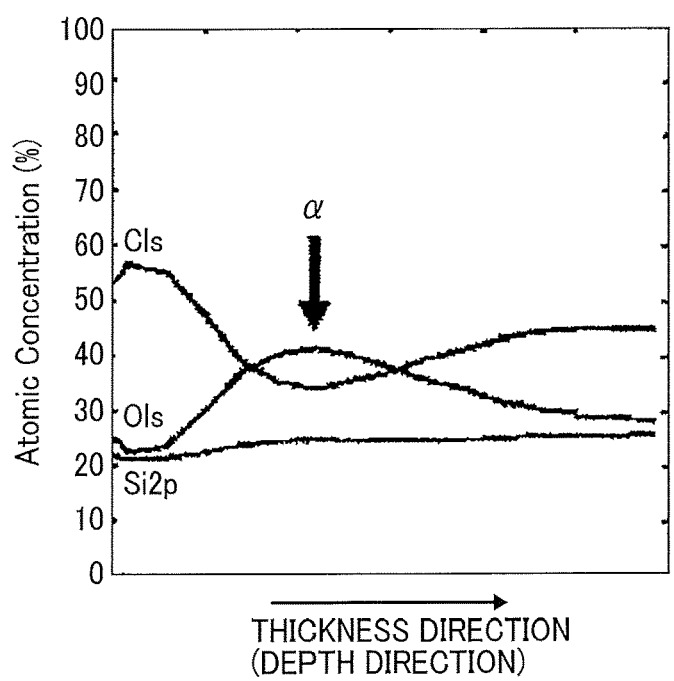
FIG. 13 is a characteristic diagram illustrating XPS measurement results of an intermediate layer (silicone rubber) which has been subjected to s surface modification treatment and an inactivation treatment.

A silicone rubber has a siloxane bond and mainly contains Si, O, and C. Therefore, when the intermediate layer is formed of the silicone rubber, a wide scan spectrum of XPS is measured, and an existence concentration ratio in a depth direction of atoms existing inside a surface layer can be determined from a relative peak intensity ratio among elements. FIG. 13 illustrates one example of the results. Herein, the atoms include Si, O, and C, and the existence concentration ratio is represented by (atomic %).

FIG. 13 illustrates a sample of an intermediate layer obtained by using a silicone rubber and further subjecting the silicone rubber to the surface modification treatment (plasma treatment) and the inactivation treatment. In FIG. 13, the horizontal axis indicates an analysis depth from a surface to an inside, and the vertical axis indicates the existence concentration ratio.

Furthermore, in a case of the silicone rubber, it is possible to know an element bonded to silicon and a bonding state by measuring energy at which electrons in a 2p orbital of Si jump out. Therefore, peak separation was performed from a narrow scan spectrum in the Si2p orbital indicating the bonding state of Si, and a chemical bonding state was determined.

Figure 14:
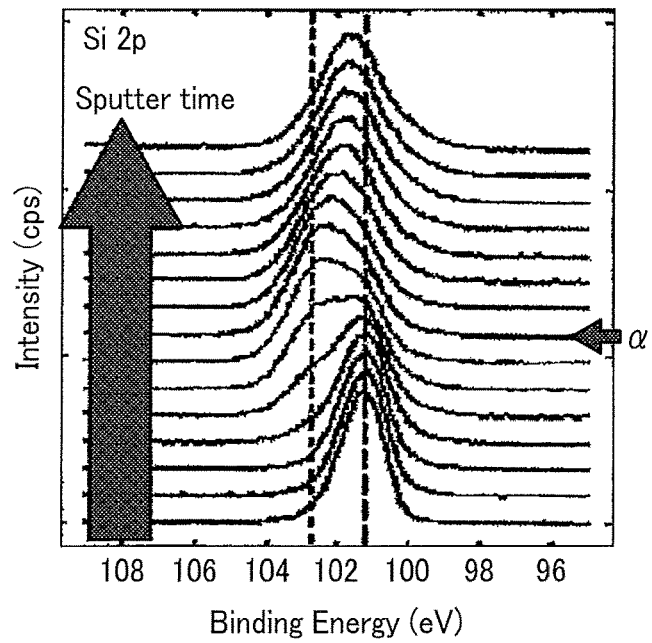
FIG. 14 is a graph illustrating a change in Si2p bond energy in a thickness direction of the intermediate layer measured in FIG. 13.

FIG. 14 illustrates the results. A measurement target in FIG. 14 is the sample used for measurement in FIG. 13. In FIG. 14, the horizontal axis indicates bond energy and the vertical axis indicates an intensity ratio. A measurement spectrum in a depth direction is indicated from the bottom to the top.

In general, it is known that the amount of a peak shift depends on a bonding state. In the present case of the silicone rubber, a fact that a peak shifts to a high energy side in the Si2p orbital means that the number of oxygen atoms bonded to Si increases.

According to this result, when the silicone rubber is subjected to the surface modification treatment and the inactivation treatment, the silicone rubber has a concentration profile in which the number of oxygen atoms increases to have a local maximum value and the number of carbon atoms decreases to have a local minimum value from a surface layer to an inside. If the analysis is further performed in a depth direction, the number of oxygen atoms decreases and the number of carbon atoms increases, resulting in an atomic existence concentration equivalent to the atomic existence concentration of an almost untreated silicone rubber.

Furthermore, the local maximum value of oxygen detected at the position a in FIG. 13 is consistent with a fact that the Si2p bond energy shifts to a high energy side (position a in FIG. 14), and this indicates that the increase in oxygen is caused by the number of oxygen atoms bonded to Si.

Figure 15:
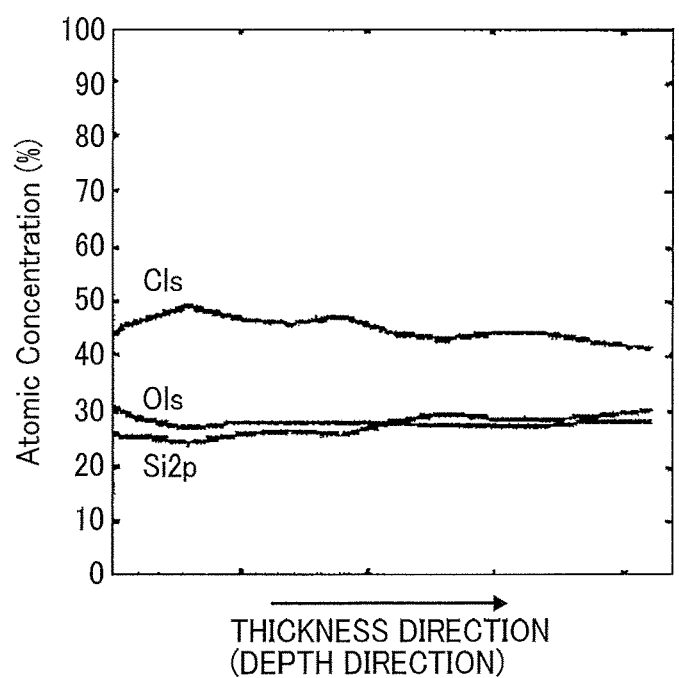
FIG. 15 is a characteristic diagram illustrating XPS measurement results of an untreated intermediate layer (silicone rubber)
Figure 16:
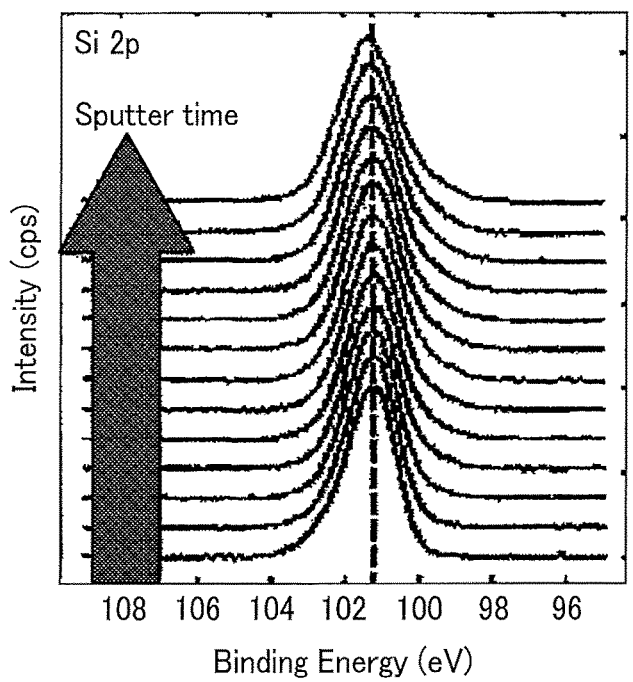
FIG. 16 is a graph illustrating a change in Si2p bond energy in a thickness direction of the intermediate layer measured in FIG. 15.

FIGS. 15 and 16 illustrate results of similar analysis on an untreated silicone rubber.

In FIG. 15, a local maximum value of the oxygen concentration and a local minimum value of the carbon concentration as illustrated in FIG. 13 are not found. Furthermore, in FIG. 16, the Si2p bond energy does not shift to a high energy side, and therefore it has been confirmed that the number of oxygen atoms bonded to Si has not changed.

As described above, an inactivating agent such as a coupling agent is applied onto a surface of the intermediate layer or the surface is dipped in the inactivating agent, and the inactivating agent permeates the surface. As a result, the inactivating agent permeates the intermediate layer. In a case where the coupling agent is a compound represented by general formula (1) or the like, polyorganosiloxane is present with a concentration distribution in the intermediate layer. In this distribution, oxygen atoms contained in the polyorganosiloxane have a local maximum value in a depth direction.

As a result, the intermediate layer contains a polyorganosiloxane having a silicon atom bonded to three or four oxygen atoms.

Note that the method for the inactivation treatment is not limited to the dipping method. For example, a method such as plasma chemical vapor deposition (CVD), physical vapor deposition (PVD), sputtering, vacuum vapor deposition, or combustion chemical vapor deposition may be used as long as a distribution in which an oxygen atom contained in the polyorganosiloxane has a local maximum value in the depth direction (thickness direction) of the intermediate layer can be realized.

The intermediate layer does not need to have an initial surface potential in a stationary state. Note that the initial surface potential in the stationary state can be measured under the following measurement conditions. Herein, the phrase "having no initial surface potential" means that the initial surface potential is +10 V or less when measurement is performed under the following measurement conditions.

{Measurement Condition}

Pretreatment: A sample was allowed to stand in an atmosphere of a temperature of 30° C. and a relative humidity of 40% for 24 hours, and then static electricity was removed for 60 seconds (using SJ-F 300 manufactured by Keyence Corporation)

Apparatus: Treck Model 344
Measurement probe: 6000B-7C
Measurement distance: 2 mm
Measurement spot diameter: diameter 10 mm In the element of the present embodiment, charging by a mechanism similar to frictional charging and generation of a surface potential difference due to internal charge retention generate a bias in an electrostatic capacity due to a difference in deformation amount based on a difference in hardness between both surfaces of the intermediate layer. As a result, it is presumed that electric charges migrate and power is generated.

The element preferably has a space between the intermediate layer and at least one of the first electrode and the second electrode. By forming the space, the amount of power generation can be increased.

A method for forming the space is not particularly limited, and can be appropriately selected according to a purpose. For example, a spacer is disposed between the intermediate layer and at least one of the first electrode and the second electrode.

The material, form, shape, size, and the like of the spacer are not particularly limited, and can be appropriately selected according to a purpose. Examples of the material of the spacer include a polymer material, a rubber, a metal, a conductive polymer material, and a conductive rubber composition.

Examples of the polymer material include polyethylene, polypropylene, polyethylene terephthalate, polyvinyl chloride, a polyimide resin, a fluorocarbon resin, and an acrylic resin. Examples of the rubber include a silicone rubber, an acrylic rubber, a chloroprene rubber, a polysulfide rubber, a urethane rubber, a butyl rubber, a natural rubber, an ethylene-propylene rubber, a nitrile rubber, fluororubber, an isoprene rubber, a butadiene rubber, a styrene-butadiene rubber, an acrylonitrile-butadiene rubber, an ethylene-propylene-diene rubber, a chlorosulfonated polyethylene rubber, polyisobutylene, and modified silicone.

Examples of the metal include gold, silver, copper, aluminum, stainless steel, tantalum, nickel, and phosphor bronze. Examples of the conductive polymer material include polythiophene, polyacetylene, and polyaniline. Examples of the conductive rubber composition include a composition containing a conductive filler and a rubber. Examples of the conductive filler include a carbon material (for example, Ketjen black, acetylene black, graphite, carbon fiber, carbon nanofiber, carbon nanotube, or graphene), a metal (for example, gold, silver, platinum, copper, iron, aluminum, or nickel), a conductive polymer material (for example, a derivative of any one of polythiophene, polyacetylene, polyaniline, polypyrrole, polyparaphenylene, and polyparaphenylenevinylene, or a product obtained by adding a dopant represented by an anion or a cation to these derivatives), and an ionic liquid.

Examples of the rubber include a silicone rubber, an acrylic rubber, a chloroprene rubber, a polysulfide rubber, a urethane rubber, a butyl rubber, a natural rubber, an ethylene-propylene rubber, a nitrile rubber, fluororubber, an isoprene rubber, a butadiene rubber, a styrene-butadiene rubber, an acrylonitrile-butadiene rubber, an ethylene-propylene-diene rubber, a chlorosulfonated polyethylene rubber, polyisobutylene, and modified silicone.

Examples of the form of the spacer include a sheet, a film, a woven fabric, a nonwoven fabric, a mesh, and a sponge.

The shape, size, thickness, and disposition place of the spacer can be appropriately selected according to the structure of the element.

Figure 17:
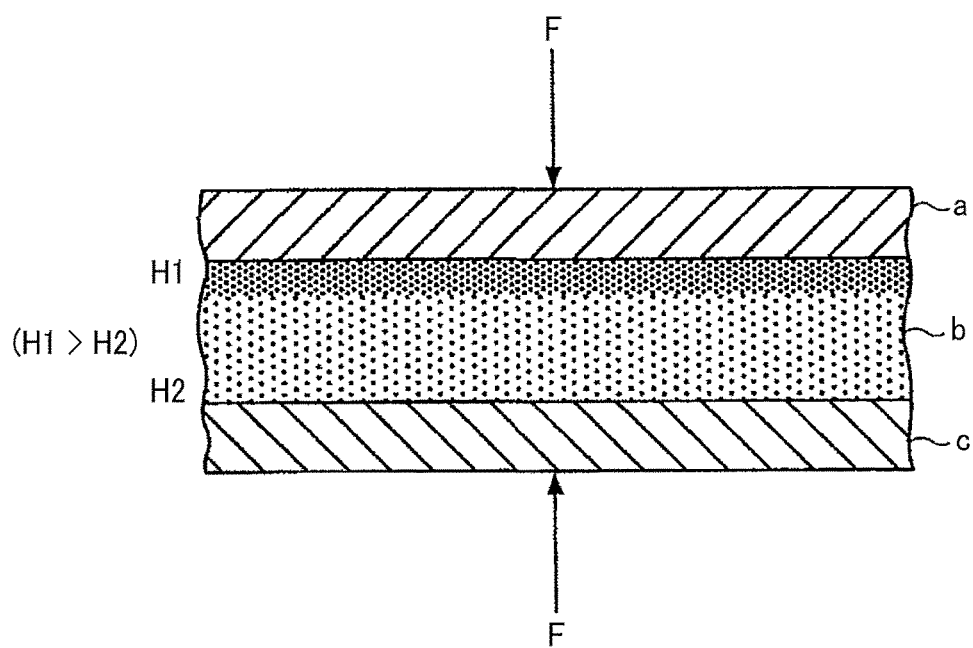
FIG. 17 is a schematic cross-sectional view for describing a characteristic of an element including an intermediate layer which has been subjected to a surface modification treatment and an inactivation treatment.

As illustrated in FIG. 17, when the first electrode is denoted by a, the intermediate layer is denoted by b, and the second electrode is denoted by c, the side of the first electrode a of the intermediate layer b is harder than the side of the second electrode c in a case where the side of the first electrode a of the intermediate layer b is subjected to the surface modification treatment or inactivation treatment. Therefore, H1>H2 is satisfied for universal hardness.

As a result, in a case where the applied pressure F which is the same deformation imparting force is applied on the side of the first electrode a and the side of the second electrode c, the degree of deformation on the side of the first electrode a of the intermediate layer b is smaller than the degree of deformation on the side of the second electrode c.

In each of the above embodiments, each of the sensors 10 to 10D is constituted by laminating the plurality of power generation elements 4 or power generation elements 4A having the same configuration and the same output via the insulating layer 5 or 5A, the foam 12, and the sponge 12A. However, as the (elements) used for the sensors 10 to 10D, elements having different outputs may be laminated via the insulating layer 5 or 5A, the foam 12, and the sponge 12A to constitute the sensors.

The thickness, material, and the like of the intermediate layer 3 formed of a rubber or a rubber composition and interposed between the first electrode 1 and the second electrode 2 of each power generation element may be different between the side of the upper layer power generation element 6 or 6A and the side of the lower layer power generation element 7 or 7A.

As described above, by making the characteristics of elements constituting the upper layer power generation element 6 or 6A of each of the sensors 10 to 10D different from the characteristics of elements constituting the lower layer power generation element 7 or 7A, even one sensor can further increase the number of stages of an output form and can improve quality. Therefore, this case is preferable. In particular, by increasing the output which is detection sensitivity of the lower layer power generation element 7 or 7A, the output when the strong pressure (overload) F is applied to a sensor can be increased. Therefore, for example, in a case where this sensor is used as a collision detection sensor, a stronger output is obtained as an impact force on the sensor is stronger. Therefore, the degree of danger may be determined according to this output signal.

Hitherto, the preferred embodiments and Example of the present disclosure have been described. However, the present disclosure is not limited to such specific embodiments and Example. Unless otherwise specified in the above description, various modifications and changes are possible within the scope of the gist of the present disclosure described in claims.

The effects described in the embodiments of the present disclosure indicate only a list of the most preferable effects obtained by the present disclosure, and the effects of the present disclosure are not limited to the effects described in the embodiments of the present disclosure.

The above-described embodiments are illustrative and do not limit the present disclosure. Thus, numerous additional modifications and variations are possible in light of the above teachings. For example, elements and/or features of different illustrative embodiments may be combined with each other and/or substituted for each other within the scope of the present disclosure.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA), and conventional circuit components arranged to perform the recited functions.

What is claimed is:

1. A sensor comprising: a plurality of elements deformable to generate power; and an insulating layer interposed between the plurality of elements, each of the plurality of elements including: a pair of electrodes; and an intermediate layer disposed between the pair of electrodes and formed of one of a rubber and a rubber composition, and has been subjected to a surface modification treatment such that a first side of the intermediate layer in a lamination direction having a different degree of deformation than a second side of the intermediate layer in the lamination direction with respect to a same deformation imparting force; wherein the intermediate layer is formed of a silicone rubber having a siloxane bond, and the silicone rubber has a concentration profile in which a number of oxygen atoms increases from the first side of the intermediate layer having a smaller degree of deformation toward the second side of intermediate layer in the lamination direction such that an inside portion of the intermediate layer between the first and second sides of the intermediate layer has a local maximum value, and a number of carbon atoms decreases from the first side of the intermediate layer toward the second side of the intermediate layer in the lamination direction such that the inside portion of the intermediate layer between the first and second sides of the intermediate layer has a local minimum value.

2. The sensor according to claim 1, wherein the insulating layer includes a gap formed by a support disposed between the plurality of elements.

3. The sensor according to claim 1, wherein the insulating layer is formed of an elastic body.

4. A sensor system comprising: the sensor according to claim 1; and a processor configured to process an output signal output from the sensor when an external force is applied to the sensor.

5. The sensor system according to claim 4, further comprising a determiner configured to acquire information on a pulsation of a human body from the output signal output from the sensor to determine presence of a person based on the information on the pulsation of the human body.

6. The sensor system according to claim 4, further comprising a determiner configured to separately determine presence of a person and movement of a person due to a change in pressure, based on the output signal output from the sensor.

7. The sensor according to claim 1, wherein a universal hardness (H1) at a time of indentation depth of 10 μm at the first side of the intermediate layer is different from a universal hardness (H2) at a time of indentation depth of 10 μm at the second side of the intermediate layer.

8. The sensor according to claim 7, wherein a ratio H1/H2 is between 1.01 and 1.70.

9. The sensor according to claim 8, wherein the ratio H1/H2 is between 1.07 and 1.70.

10. The sensor according to claim 9, wherein the ratio H1/H2 is between 1.13 and 1.70.

* * * * *